United States Patent [19]
Jiang et al.

[11] Patent Number: 6,026,111
[45] Date of Patent: Feb. 15, 2000

[54] VERTICAL CAVITY SURFACE EMITTING LASER DEVICE HAVING AN EXTENDED CAVITY

[75] Inventors: Wenbin Jiang, Phoenix; Michael S. Lebby, Apache Junction; Jamal Ramdani, Gilbert, all of Ariz.

[73] Assignee: Motorola, Inc., Schaumburg, Ill.

[21] Appl. No.: 08/959,572

[22] Filed: Oct. 28, 1997

[51] Int. Cl.$^7$ .................................................. H01S 3/08
[52] U.S. Cl. ........................... 372/96; 372/98; 372/101; 372/103; 372/45; 372/50; 372/46
[58] Field of Search ............................... 372/96, 98, 101, 372/103, 45, 50, 46

[56] References Cited

U.S. PATENT DOCUMENTS

| | | | |
|---|---|---|---|
| 5,115,441 | 5/1992 | Kopf et al. | 372/45 |
| 5,317,587 | 5/1994 | Ackley et al. | 372/45 |
| 5,530,715 | 6/1996 | Shieh et al. | 372/96 |

*Primary Examiner*—Rodney Bovernick
*Assistant Examiner*—Sung T. Kim
*Attorney, Agent, or Firm*—Eugene A. Parsons; William E. Koch

[57] ABSTRACT

An extended VCSEL structure formed of a first DBR mirror, an active region, a second DBR mirror as partial reflector, and an extended cavity provided by a transparent conductive substrate wafer fused onto the second DBR mirror. The transparent conductive substrate also serves as a convex mirror with a highly reflective dielectric coating to complete the extended cavity VCSEL structure. The use of the extended cavity makes high power single mode operation achievable because an extended cavity introduces high modal loss to the high order laser modes while supporting the lowest order single mode. The large active area allows high output power from the VCSEL.

25 Claims, 1 Drawing Sheet

VERTICAL CAVITY SURFACE EMITTING LASER DEVICE HAVING AN EXTENDED CAVITY

FIELD OF THE INVENTION

This invention relates to vertical cavity surface emitting lasers and more specifically to vertical cavity surface emitting lasers for high power single mode operation.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As/Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In conventional VCSELs, conventional material systems perform adequately. However, new products are being developed, such as CD write devices and those utilizing infra-red data links, that require VCSELs to operate in a high power single mode. In general, VCSELs typically operate in a multimode due to carrier spatial hole burning and ring p-side metal contact induced current crowding effect. Such a carrier distribution will support multimode operation due to higher modal gain for high order modes. In that single mode operation is sought, some way must be adopted to suppress the high order modes.

It would be highly advantageous, therefore, to remedy the foregoing and other deficiencies inherent in the prior art.

Thus, it is an object of the present invention to develop a reliable, stable and cost effective vertical cavity surface emitting laser (VCSEL) for use in high power single mode operations.

Another object of the invention is to provide a reliable high power single mode VCSEL.

And another object of the immediate invention is to provide for efficient mode control in a high power single mode VCSEL.

Yet another object of the invention is to provide for a highly manufacturable high power single mode VCSEL.

SUMMARY OF THE INVENTION

The above problems are at least partially solved and the above objects are realized in a vertical cavity surface emitting laser device having an extended cavity defined by a first stack of distributed Bragg disposed on the surface of a substrate, an active region disposed on the first stack of distributed Bragg reflectors, a second stack of distributed Bragg reflectors disposed on the active region, and a second substrate positioned on the surface of the second stack of distributed Bragg reflectors to extend the optical cavity of the vertical cavity surface emitting laser device. The second substrate can also be formed into a dome shape and reflective coated so that the second substrate behaves like a convex reflector.

The use of the extended cavity makes high power single mode operation achievable because an extended cavity introduces high modal loss to the high order laser modes while supporting the lowest order single mode, even with a large active area. The large active area allows high output power from the VCSEL.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawing, in which.

DETAILED DESCRIPTION OF THE DRAWING

Figure 1:
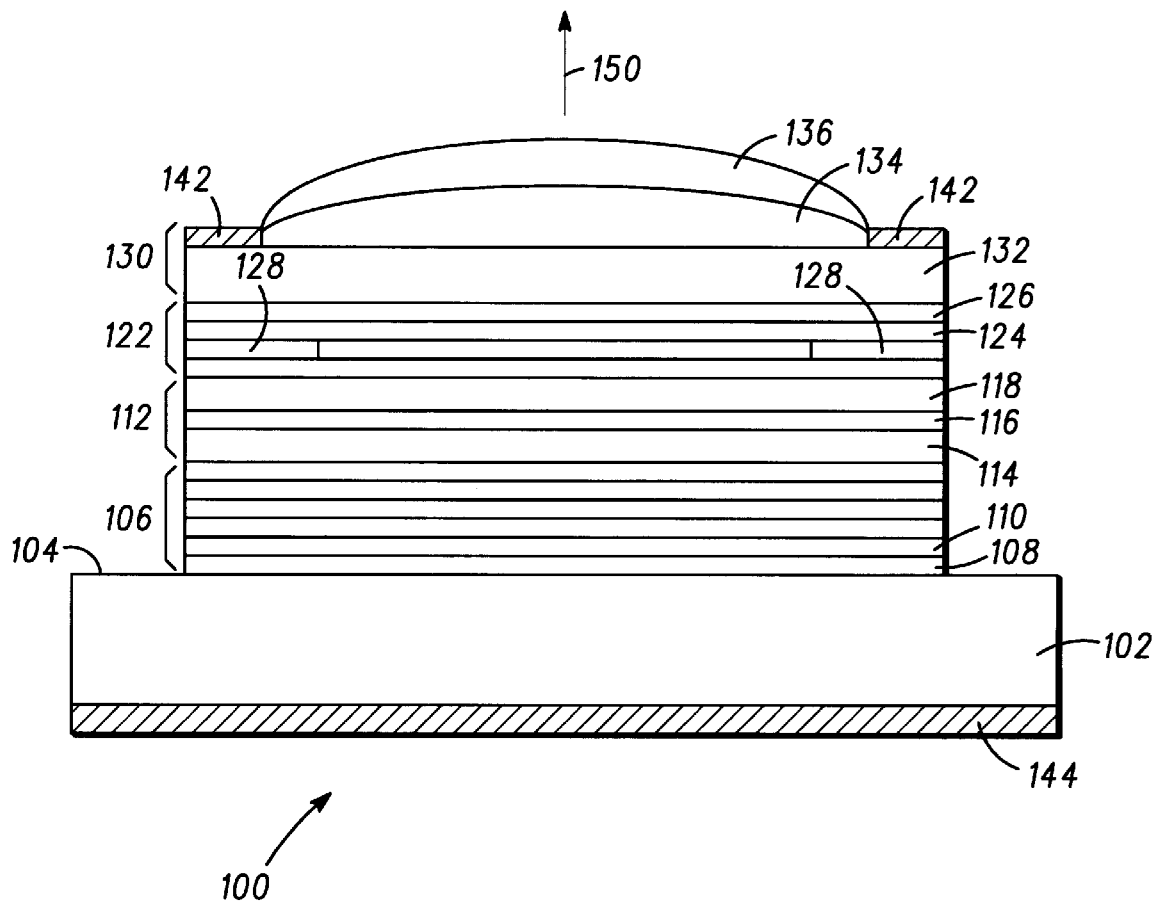
FIG. 1 is a sectional view of a VCSEL structure with an extended laser cavity in accordance with the present invention.

Turning now FIG. 1, the fabrication of a vertical cavity surface emitting laser (VCSEL) structure, or VCSEL device, generally designated 100 is illustrated. Wafer structure, or device, 100 in this particular embodiment is formed as a planar wafer structure. Wafer structure 100 is formed on a substrate 102, which in this specific embodiment is gallium arsenide (GaAs). GaAs is preferably used to facilitate lattice matching of the components of wafer structure 100 which in this particular embodiment emits infrared wavelength light, more particularly light in a range of 770 nm to 870 nm, dependent upon the specific material system used. Also, a GaAs substrate is utilized so as to facilitate epitaxial growth of subsequent multiple layers that compose wafer structure 100. It should be understood that GaAs is only utilized as an example and other semiconductor materials may be employed as substrate 102, such as silicon (Si), indium phosphide (InP), or the like. Additionally, dependent upon the material system, a broad spectrum of wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 100. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise part of the VCSEL device of the present invention.

Substrate 102 has an upper surface 104 on which a first mirror stack 106 of distributed Bragg reflectors is disposed. An active region 112 is disposed on mirror stack 106. Active region 112 includes an active structure 116 sandwiched between a first cladding region 114 adjacent first mirror stack 106 and a second cladding region 118. A second mirror stack 122 of distributed Bragg reflectors is disposed on second cladding region 118.

It should be understood that mirror stack 106 is deposited first with subsequent depositions defining cladding region 114, active structure 116, cladding region 118, and mirror stack 122. Mirror stacks 106 and 122 are each composed of a plurality of layers, represented by pairs of alternating layers 108, 110, and 124, 126, respectively. Generally, thicknesses of alternating layers 108, 110, and 124, 126 are typically set as portions of a wavelength of light (not shown) that the complete VCSEL device is designed to emit. Thus, specific thicknesses of the alternating layers 108, 110, and 124, 126 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of mirror stacks 106 and 122 is split with one of the mirror stacks being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, mirror stack 106 and a portion of cladding region 114 are N-type doped, with a portion of cladding region 114, active structure 116, and a portion of cladding region 118 being undoped, and with a portion of cladding region 118, and mirror stack 122 being P-type doped.

In the present invention, mirror stacks 106 and 122 having alternating layers 108, 110, and 124, 126 are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As/Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that mirror stack 122 does not provide enough reflectivity by itself to support the VCSEL lasing action. Typically, the number of mirror pairs for mirror stack 122 is between 2 to 15 pairs with a preferred number of pairs to be between 5 to 10 pairs.

More specifically, a VCSEL structure designed to emit at 780 nm will include alternating layers 108, 110 and 124, 126 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 108, 110 and 124, 126 of $Al_{0.15}Ga_{0.85}As/Al_{0.85}Ga_{0.15}As$. Irrespective of the material system utilized, layers 108 and 110 are epitaxially disposed or deposited on or overlaying substrate 102 and layers 124 and 126 are epitaxially disposed or deposited on or overlaying cladding region 118, thereby generating mirror stacks 106 and 122. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), and indium aluminum gallium phosphide and indium aluminum phosphide (e.g., $In_{0.49}Al_xGa_{0.51-x}P/In_{0.49}Al_{0.5}P$) are anticipated by this disclosure for a device to operate at red visible emission wavelength (635–700 nm) in association with an appropriate active medium. Additionally, it should be understood that in each of the above examples and throughout this disclosure where a percent composition of a particular element is given it should be considered only as an example.

It should be further understood that variations from these examples can be large and are to be considered part of the present invention.

Mirror stacks 106 and 122 are formed by depositing pairs of alternating layers using some convenient technique such as molecular beam epitaxy (MBE) or sputtering. In order to crystal lattice match mirror stack 106 to substrate 102 a suitable semiconductor material system must be deposited. Approximately 20–40 mirror pairs of this material system are deposited on substrate 102 depending on the difference between the refractive indices of the layers. As will be explained presently, substrate doping is not necessary since electrical contacts to the active region can be made laterally to the doped mirror stack 106.

For the sake of simplicity and to prevent overcrowding of the figure, cladding region 114 is shown as a single layer; however, it should be understood that cladding region 114, in this embodiment, is made of at least two components that are epitaxially disposed or deposited on mirror stack 106. First, a layer of any suitable material such as aluminum gallium arsenide (AlGaAs) having an appropriate thickness and doped similarly to mirror stack 106 is epitaxially deposited on mirror stack 106.

By way of example, a N-doped aluminum gallium arsenide layer ($Al_{0.60}Ga_{0.40}As$) is epitaxially deposited on mirror stack 106. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 114.

For the sake of simplicity, active structure 116 is represented by a single layer which is epitaxially deposited or disposed on cladding region 114; however, it should be understood that the active structure 116 can include multiple layers of barrier regions with quantum well regions interspersed. By way of a simple example, active structure 116 is made of two barrier layers and a quantum well region positioned between the barrier layers. In a preferred embodiment, active structure 116 is made of four barrier regions and three quantum well regions with each of the quantum well regions being positioned between two barrier regions. In a VCSEL structure that emits at 780 nm, the quantum well region is made of undoped aluminum gallium arsenide ($Al_{0.12}Ga_{0.88}As$) and the barrier regions are made of aluminum gallium arsenide ($Al_{0.30}Ga_{0.70}As$). In a VCSEL structure that emits at 850 nm, the quantum well region is made of undoped gallium arsenide (GaAs) and the barrier regions are made of aluminum gallium arsenide ($Al_{0.30}Ga_{0.70}As$). Typically, active structure 116 includes three to five quantum wells with their corresponding barrier regions. One skilled in the art will understand that more or fewer quantum well layers and barrier layers can be used depending upon the application. In this embodiment active region 112 and first and second mirror stacks 106 and 122 respectively are configured to emit light with a wavelength of approximately 780 nm or 850 nm.

For the sake of simplicity and to prevent overcrowding of the figure, cladding region 118 is shown as a single layer;

however, it should be understood that in this embodiment cladding region 118 is made of two components that are disposed or deposited epitaxially on active structure 116. First, a layer of any suitable undoped cladding material is epitaxially deposited to an appropriate thickness on active structure 116. Second, a layer of any suitable doped cladding material is epitaxially deposited on the undoped cladding material.

By way of example, an undoped aluminum gallium arsenide ($Al_{0.30}Ga_{0.70}As$) layer is epitaxially deposited on active structure 116. Generally, the undoped AlGaAs has a thickness that is determined by the wavelength of light that is to be emitted from the VCSEL device, thereby allowing the thickness of the AlGaAs layer to be any suitable thickness. Subsequently, a doped ($Al_{0.60}Ga_{0.40}As$) layer is epitaxially deposited on the undoped layer. The doped layer is generally doped with a P-type dopant.

Next, the device, or wafer structure, 100 is selectively implanted with protons ($H^+$) to define the current flow path within the device. To accomplish this, the area in which implantation is not sought is masked using a dot array mask composed of Ti:W, gold, a dielectric material, a photoresist material, or a combination thereof. The proton implants are completed with an energy of 100–300 kV. Once implanted, the device is annealed to cure any lattice defects and the dot array mask is removed. The proton implanted region is designated as isolation region 128. Alternatively, isolation region 128 can be achieved by using lateral oxidation when a thin layer of AlAs to be oxidized is sandwiched in the DBR mirror 122 during the epitaxy deposition.

After removing the implantation mask, a conductive transparent substrate 130 is fused onto VCSEL structure 100 to form an extended cavity. Transparent substrate 130 can be a doped gallium phosphide (GaP) wafer or a silicon carbide (SiC) wafer, doped with the same type of dopant as mirror stack 122, which is doped P-type in this particular embodiment. Transparent substrate 130 is formed of a flat portion 132 and a domed portion 134. On top of domed portion 134 of substrate 130 is a highly reflective dielectric mirror coating 136, so that substrate 130 behaves like a convex reflector to complete the extended cavity laser structure with the other cavity mirror provided by mirror stack 106. The radius (R) of the convex mirror defined by substrate 130 is usually determined by the total length (L) of the extended laser cavity with a relationship $R/2<L<R$. For example, if the extended laser cavity length is $L=1000 \mu m$, the radius R can be any value between 1000 and 2000 $\mu m$. Due to the existence of mirror stack 122 that provides partial light feedback into the laser cavity for the embodiment discussed in FIG. 1, the requirement for R can be relaxed into $R>L$. For example, if the extended laser cavity length $L=1000 \mu m$, the radius R can be any value larger than 1000 $\mu m$.

To complete the VCSEL structure, or device 100, an electrical contact 144 is coupled to a surface of substrate 102. A second electrical contact 142 is coupled to first portion 132 of substrate 130. Light, represented by an arrow 150, is emitted from device 100 in a direction opposite to substrate 102. The use of the extended cavity makes high power single mode operation achievable because an extended cavity introduces high modal loss to the high order laser modes while supporting the lowest order single mode, even with a large active area. The large active area allows high output power from the VCSEL 100.

Various changes and modifications to the embodiments herein chosen for purposes of illustration will readily occur to those skilled in the art. For example, it should be understood that VCSEL structure symmetry exists for both the p and n dopants as well as electrically inverted structure designs.

What is claimed is:

1. A vertical cavity surface emitting laser device having an extended cavity comprising:
    a first substrate having a surface;
    a first stack of distributed Bragg reflectors disposed on the surface of the substrate;
    an active region disposed on the first stack of distributed Bragg reflectors;
    a second stack of distributed Bragg reflectors disposed on the active region;
    a second substrate having a first surface and a second surface the first surface of the second substrate being disposed on the second stack of distributed Bragg reflectors to extend an optical cavity of the vertical cavity surface emitting laser device; and
    a reflective coating disposed on the second surface of the second substrate.

2. A vertical cavity surface emitting laser device having an extended cavity as claimed in claim 1 wherein the second substrate is made of a conductive material.

3. A vertical cavity surface emitting laser device having an extended cavity as claimed in claim 2 wherein the second substrate is made of gallium arsenide.

4. A vertical cavity surface emitting laser device having an extended cavity as claimed in claim 2 wherein the conductive material is a doped gallium phosphide material.

5. A vertical cavity surface emitting laser device having an extended cavity as claimed in claim 1 wherein the second substrate is made of a silicon carbide material.

6. A vertical cavity surface emitting laser device having an extended cavity as claimed in claim 1 wherein the first substrate is made of a first semiconductor material.

7. A vertical cavity surface emitting laser device having an extended cavity as claimed in claim 6 wherein the first semiconductor material is a gallium arsenide material.

8. A vertical cavity surface emitting laser device having an extended cavity as claimed in claim 7 wherein the second substrate is made of a second semiconductor material.

9. A vertical cavity surface emitting laser device having an extended cavity as claimed in claim 8 wherein the second semiconductor material is a gallium phosphide material.

10. A vertical cavity surface emitting laser device having an extended cavity comprising:
    a first substrate having a surface;
    a first stack of distributed Bragg reflectors having a first dopant type disposed on the surface of the substrate;
    an active region having a first cladding region, a quantum well, and a second cladding region disposed on the first stack of distributed Bragg reflectors;
    a second stack of distributed Bragg reflectors having a second dopant type disposed on the active region;
    a second substrate having a first surface and a second surface, the first surface of the second substrate being disposed on the second stack of distributed Bragg reflectors and the second surface being formed to a desired shape to extend an optical cavity of the vertical cavity surface emitting laser device; and
    a reflective coating disposed on the second surface of the second substrate.

11. A vertical cavity surface emitting laser device having an extended cavity as claimed in claim 10 wherein the first dopant type is an n-type dopant.

12. A vertical cavity surface emitting laser device having an extended cavity as claimed in claim 10 wherein the second dopant type is a p-type dopant.

13. A vertical cavity surface emitting laser device having an extended cavity comprising:

a first substrate having a surface;

a first stack of distributed Bragg reflectors having a first dopant type disposed on the surface of the substrate;

a active region having a first cladding region, a quantum well, and a second cladding region disposed on the first stack of distributed Bragg reflectors;

a second stack of distributed Bragg reflectors having a second dopant type disposed on the active region;

a second substrate having a first surface and a second surface, the first surface of the second substrate being disposed on the second stack of distributed Bragg reflectors and the second surface being formed to a desired shape to extend an optical cavity of the vertical cavity surface emitting laser device; and a reflective coating disposed on the second surface of the second substrate.

14. A vertical cavity surface emitting laser device having an extended cavity as claimed in claim 13 wherein the first dopant type is an n-type dopant.

15. A vertical cavity surface emitting laser device having an extended cavity as claimed in claim 13 wherein the second dopant type is a p-type dopant.

16. A vertical cavity surface emitting laser device having an extended cavity as claimed in claim 13 wherein the second substrate is made of a doped semiconductor material.

17. A vertical cavity surface emitting laser device having an extended cavity as claimed in claim 16 wherein the second substrate is made of gallium arsenide.

18. A vertical cavity surface emitting laser device having an extended cavity as claimed in claim 16 wherein the semiconductor material is a gallium phosphide material.

19. A vertical cavity surface emitting laser device having an extended cavity as claimed in claim 13 wherein the second substrate is made of a silicon carbide material.

20. A vertical cavity surface emitting laser device having an extended cavity as claimed in claim 13 wherein the first substrate is made of a first semiconductor material.

21. A vertical cavity surface emitting laser device having an extended cavity as claimed in claim 20 wherein the first semiconductor material is a gallium arsenide material.

22. A vertical cavity surface emitting laser device having an extended cavity as claimed in claim 13 wherein the second substrate is made of a second semiconductor material.

23. A vertical cavity surface emitting laser device having an extended cavity as claimed in claim 22 wherein the second semiconductor material is a gallium phosphide material.

24. A vertical cavity surface emitting laser device having an extended cavity as claimed in claim 13 wherein the desired shape of the second substrate is a convex shape.

25. A method for making vertical cavity surface emitting laser device having an extended cavity comprising:

providing a first substrate having a surface;

forming a first stack of distributed Bragg reflectors having a first dopant type disposed on the surface of the substrate;

forming an active region having a first cladding region, a quantum well, and a second cladding region on the first stack of distributed Bragg reflectors;

forming a second stack of distributed Bragg reflectors having a second dopant type on the active region;

forming a second substrate having a first surface and a second surface, positioning the first surface of the second substrate on the second stack of distributed Bragg reflectors and forming the second surface to a desired shape to extend an optical cavity of the vertical cavity surface emitting laser device; and forming a reflective coating disposed on the second surface of the second substrate.

\* \* \* \* \*